US 7,050,595 B2

(12) United States Patent
Komiyama et al.

(10) Patent No.: US 7,050,595 B2
(45) Date of Patent: May 23, 2006

(54) AUDIO MIXING CIRCUIT

(75) Inventors: Setsu Komiyama, Tokyo (JP); Kimio Hamasaki, Tokyo (JP)

(73) Assignee: Nippon Hoso Kyokai, Tokyo (JP)

( * ) Notice: Subject to any disclaimer, the term of this patent is extended or adjusted under 35 U.S.C. 154(b) by 5 days.

(21) Appl. No.: 10/765,914

(22) Filed: Jan. 29, 2004

(65) Prior Publication Data
US 2004/0184624 A1    Sep. 23, 2004

(30) Foreign Application Priority Data
Jan. 29, 2003    (JP)    ............... 2003-020801

(51) Int. Cl.
*H04B 1/00*    (2006.01)
*H03G 3/00*    (2006.01)
*H03G 5/00*    (2006.01)
(52) U.S. Cl. .................. 381/119; 381/61; 381/103
(58) Field of Classification Search ............... 381/119, 381/102–109, 98, 61
See application file for complete search history.

(56) References Cited

U.S. PATENT DOCUMENTS 4,701,722 A * 10/1987 Dolby ................. 333/14

2002/0031231 A1 * 3/2002 Oinoue et al. ............ 381/1

OTHER PUBLICATIONS

John M. Eagle, "Handbook of Recording Engineering", Published on 1986, Van Nostrand Reinhold Company, Inc.
Maekawa et al., "Kenchiku-Kankyo Onkyo-Gaku (Architectural-Environmental Acoustics) Second Edition" with Partial English translation, Published on Sep. 25, 2000, Kyoritsu Shuppan, Co., Ltd.

* cited by examiner

*Primary Examiner*—Laura A. Grier
(74) *Attorney, Agent, or Firm*—Armstrong, Kratz, Quintos, Hanson & Brooks, LLP

(57) ABSTRACT

An audio mixing circuit used in an audio mixing console includes an equalizer, a fader cascaded to the equalizer, a distance filter cascaded to the fader, and a pan circuit cascaded to the distance filter. The distance filter is configured to attenuate and increase an audio signal level of an input audio signal in an entire audio-frequency band and an audio signal level of a high-audio-frequency component extracted from the input audio signal, in a correlated manner. Thus, a natural transition of sense of distance can be adjusted with a simple operation without the need for adjusting three elements of the fader, equalizer and an AUX feed from the post-fader terminal at the same time.

3 Claims, 4 Drawing Sheets

AUDIO MIXING CIRCUIT

BACKGROUND OF THE INVENTION

This invention relates to an audio mixing circuit for use in audio mixing consoles (audio mixers) or the like.

FIG. 4 shows a block diagram of one exemplary arrangement of conventional audio mixing consoles.

As shown in FIG. 4, an audio mixing circuit making up an audio mixing console includes a head amplifier 15, an equalizer 16, a fader 17, and a pan circuit 18. It is also shown in FIG. 4 that two more audio mixing circuits each having the same circuitry as described above are provided as indicated each by a broken line drawn like a box.

An audio signal impressed at an input terminal 14 is amplified to a prescribed level by the head amplifier 15, and a timbre thereof is then adjusted by the equalizer 16. Thereafter, the signal output from the equalizer 16 is given to the fader 17, usually constructed of a variable resistor, in which a volume thereof is adjusted. The signal output from the fader 17 is fed to the pan circuit 18, and is divided therein into a left channel bus (BUS) 19 and a right channel bus (BUS) 19 in a proportion determined according to a desired location of the final output sound.

The input and output signals of the fader 17 are also transmitted through a changeover switch to an external channel AUX 22. As illustrated in FIG. 4, the changeover switch is comprised of three terminals, which includes a pre-fader terminal 20 connected to the input of the fader 17, a post-fader terminal 21 connected to the output of the fader 17, and a terminal connected to the AUX 22. The AUX 22 is connected to an external reverb circuit 23, in which a reverberation component is obtained from the input signal. The reverberation signal output from the reverb circuit 23 is fed through the input terminals 24, 25 to both of the two separate audio mixing circuits each indicated by a broken line drawn like a box, and signals output from these audio mixing circuits are added respectively to the original signals in the BUS 19. The above-described arrangement of the conventional audio mixing consoles is disclosed for example in John M Eargle, "HANDBOOK OF RECORDING ENGINEERING", 1986, Van Nostrand Reinhold Company, Inc., New York, U.S.A.

The function of the audio mixing circuit in the above-described conventional audio mixing console is for example to adjust a timbre, volume, sense of direction, sense of distance of an input sound by manipulating the equalizer 16, fader 17 and pan circuit 18. Among these elements to be adjusted, the sense of distance is adjusted by regulating a volume and timbre of the sound, and a ratio of energy between direct and indirect sounds in accordance with the distance. However, in order to produce such a natural sense of distance as if a sound source is moving away, only to individually manipulate each of the above-recited elements to be adjusted is not sufficient. Rather, disadvantageously, lowering the volume of the sound, attenuating a high-audio-frequency component assumed to be absorbed in air (see Junichi Maekawa, Masayuki Morimoto, Kimihiro Sakagami, "KENCHIKU-KANKYO ONKYO-GAKU (Architectural-Environmental Acoustics)", Second Edition, Sep. 25, 2000, Kyoritsu Shuppan, Co. Ltd., Tokyo Japan; pp. 53, 97), and lowering the ratio of a direct sound to an indirect sound all should be carried out simultaneously.

When these operations are to be carried out simultaneously on a conventional audio mixing circuit, to be more specific, distance attenuation (uniform attenuation throughout all audio frequencies) of the sound should be performed using the fader 17, and attenuation of high-audio-frequency components of the sound should be performed using the equalizer 16, and the ratio of a direct sound to an indirect sound should be adjusted by generating an indirect sound component in the reverb circuit 23 from a signal transmitted from the pre-fader terminal 20 through the AUX 22 and transmitting the resultant signal to the other two audio mixing circuits (as indicated by broken lines in FIG. 4) to regulate a ratio of the indirect sound component to be mixed with the original signal.

To adequately adjust the sense of distance of the output sound, the equalizer 16, fader 17 and AUX 22 (quantity of signals transmitted therethrough) are all to be synchronously manipulated in a correlated manner. However, such synchronous operation of these three elements real-time is so difficult that, in actuality, operation of one of these elements, e.g., equalizer 16, should have unavoidably been omitted. Accordingly, natural transition of sense of distance could not be achieved in most instances.

Although the above description has been directed to one example of adjusting a sense of distance in the output sound to one that sounds as if a sound source is moving away, the same problem would come up on adjusting a sense of distance to one that sounds as if the sound source is approaching; i.e., the equalizer 16, fader 17 and AUX 22 (quantity of signals transmitted therethrough) all should disadvantageously be manipulated synchronously in a correlated manner, which is close to impossible.

The present invention has been made to address the above-discussed disadvantages.

SUMMARY OF THE INVENTION

In one exemplified aspect of the present invention, there is provided an audio mixing circuit which includes an equalizer, a fader cascaded to the equalizer, a distance filter cascaded to the fader, and a pan circuit cascaded to the distance filter.

The distance filter is a device for attenuating and increasing (or amplifying) an audio signal level of an input audio signal in an entire audio-frequency band and an audio signal level of a high-audio-frequency component extracted from the input audio signal, in a correlated manner.

In the above audio mixing circuit, the distance filter may include a variable attenuator for attenuating an input audio signal to an arbitrary (or predetermined) level, and a low-pass filter capable of varying a cutoff frequency. The variable attenuator and the low-pass filter are cascade-connected to each other; i.e., the output signal from the variable attenuator is input to the low-pass filter or the output signal from the low-pass filter is input to the variable attenuator. The amount of attenuation of the variable attenuator and the cutoff frequency of the low-pass filter are determined so that the cutoff frequency is lower when the amount of attenuation is larger.

According to the present invention, for example, an audio mixing circuit capable of adjusting a natural transition of sense of distance with a simple operation can be provided.

Other advantages and further features of the present invention will become readily apparent from the following description of preferred embodiments with reference to accompanying drawings.

DETAILED DESCRIPTION OF THE PREFERRED EMBODIMENTS

A detailed description will be given of preferred embodiments of the present invention with reference to the drawings.

Figure 1:
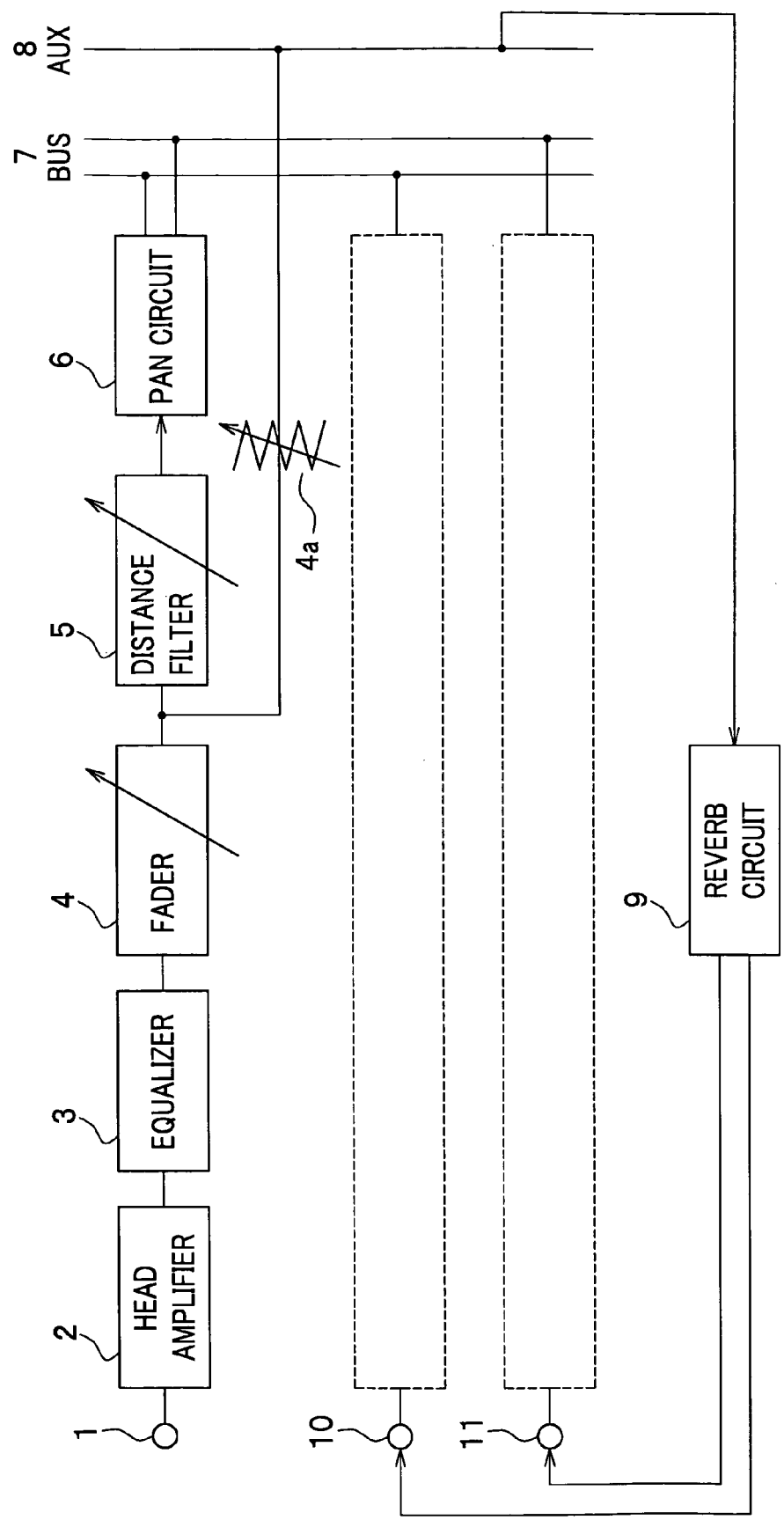
FIG. 1 is a block diagram showing one exemplary arrangement of audio mixing consoles using an audio mixing circuit according to the present invention.

FIG. 1 shows a block diagram of one exemplary arrangement of audio mixing consoles using an audio mixing circuit according to the present invention.

In FIG. 1, denoted by 1, 10 and 11 are input terminals, denoted by 2 is a head amplifier, denoted by 3 is an equalizer, denoted by 4 is a fader, denoted by 5 is a distance filter, denoted by 6 is a pan circuit, denoted by 7 is a BUS, denoted by 8 is an AUX, and denoted by 9 is a reverb circuit.

In operation, an audio signal applied to the input terminal 1 is passed (transmitted), as in the above-described conventional audio mixing circuit, through the head amplifier 2, the equalizer 3, and the fader 4, in this sequence. The output signal of the fader 4 is transmitted to the distance filter 5 for adjusting a sense of distance of a sound represented by the audio signal. In the distance filter 5, an audio signal level of the audio signal in an entire audio-frequency band and an audio signal level of a high-audio-frequency component extracted from the audio signal are attenuated or increased, in a correlated manner.

The output signal of the distance filter 5, of which the signal level of the audio signal in an entire audio-frequency band and the signal level of a high-audio-frequency component extracted therefrom have been attenuated or increased in a correlated manner, is then transmitted through the pan circuit 6 to the BUS 7. The objects and operations of the pan circuit 6 and the BUS 7 have been described above in the section captioned BACKGROUND OF INVENTION as those of the elements designated by reference numerals 18 and 19 respectively, and thus a duplicate description thereof will be omitted herein.

Figure 4:
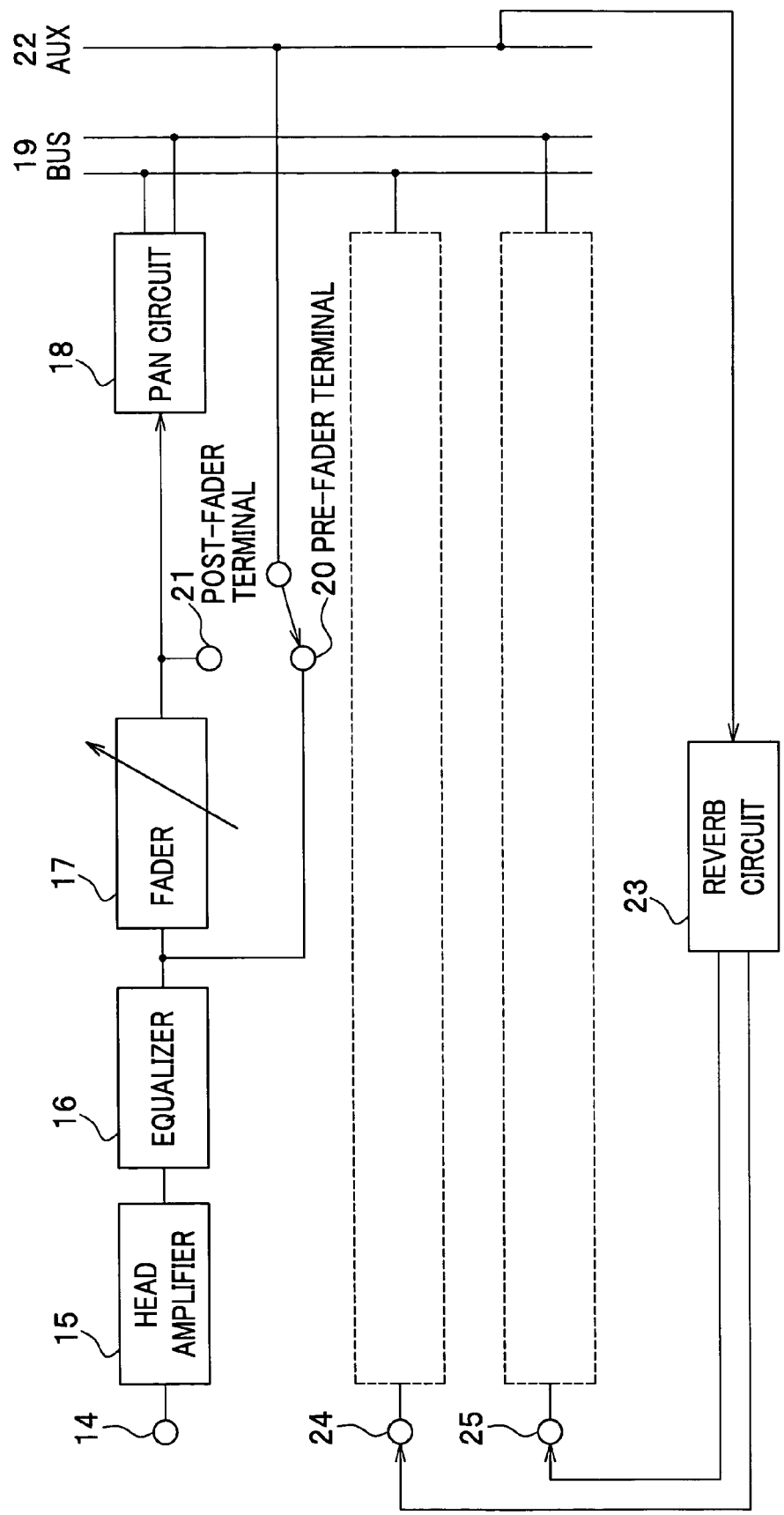
FIG. 4 is a block diagram showing one exemplary arrangement of conventional audio mixing consoles.

The output signal of the fader 4 is also transmitted through a variable attenuator 4a to the AUX 8. The output signal transmitted through the AUX 8 is fed to the external reverb circuit 9 in which a timber signal is generated and output. The output signals from the reverb circuit 9, transmitted from two output terminals thereof, are input through the input terminals 10, 11 to two separate audio mixing circuits as indicated by broken-line boxes, respectively, and the output signals of these audio mixing circuits are added to the original audio signal in the BUS 7 (see also description for FIG. 4 above).

Figure 2:
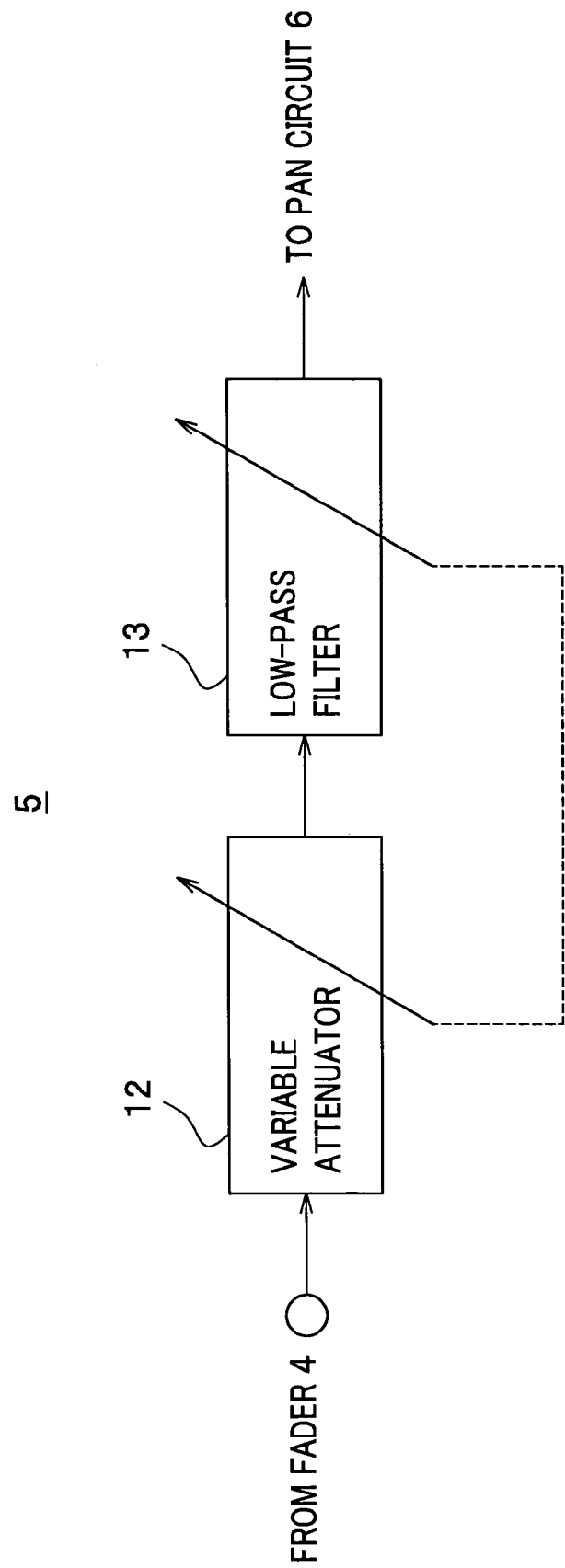
FIG. 2 is a block diagram showing a typical arrangement of a distance filter for use with the audio mixing circuit according to the present invention.

FIG. 2 shows a block diagram of a typical arrangement of the distance filter 5 for use with the audio mixing circuit according to the present invention. In FIG. 2, denoted by 12 is a variable attenuator, and denoted by 13 is a low-pass filter.

An operation of this embodiment of the distance filter 5 will now be described with reference to FIG. 2. First, an output audio signal of the fader 4 (see FIG. 1) is transmitted to the variable attenuator 12, and an output audio signal that has been attenuated in accordance with an amount of attenuation given in the variable attenuator 12 is obtained. The output audio signal as thus obtained is transmitted to the low-pass filter 13, in which an audio component signal below a specific cutoff frequency is extracted from an entire audio-frequency band and output to the pan circuit 6.

The relationship between the amount of attenuation of the variable attenuator 12 and the cutoff frequency of the low-pass filter 13 is configured in a correlationally variable manner; that is, if the amount of attenuation of the variable attenuator 12 is raised, the cutoff frequency of the low-pass filter 13 becomes lower so that an audio signal level of a high-audio-frequency component is attenuated (as if due to absorption into air).

Although the variable attenuator 12 is provided in a stage upstream of the low-pass filter 13 in one typical embodiment of the present invention as described above, the arrangement of these two components is not limited thereto, and the low-pass filter 13 may be provided in a stage upstream of the variable attenuator 12.

Figure 3:
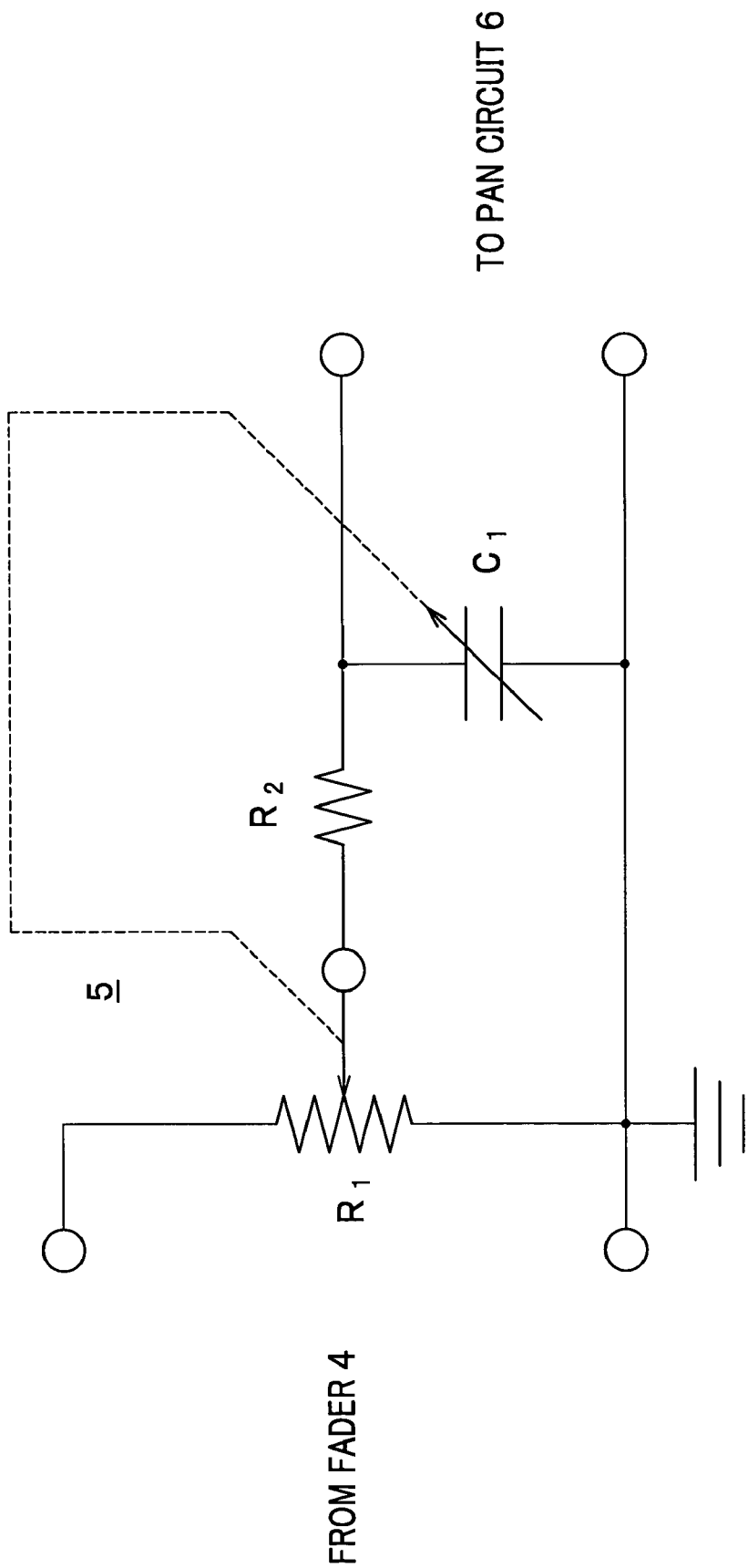
FIG. 3 is a block diagram showing a variation of the arrangement of the distance filter for use with the audio mixing circuit according to the present invention, in which a variable resistor and a low-pass filter comprised of a capacitor-resistor device are provided.

FIG. 3 illustrates a variation of the arrangement of the distance filter 5 for use with the audio mixing circuit according to the present invention, in which a variable resistor and a low-pass filter comprised of a capacitor-resistor (CR) device are provided. In FIG. 3, denoted by R1 is a variable resistor, denoted by R2 is a resistor, and denoted by C1 is a variable capacitor.

An operation of this embodiment of the distance filter 5 will now be described with reference to FIG. 3. First, at both ends (of which one is grounded) of the variable resistor R1 is impressed an output audio signal of the fader 4 (see FIG. 1), and an audio signal that has been voltage-divided in an arbitrary (or predetermined) proportion between a sliding contact of the variable resistor R1 and the ground is obtained. Thus-obtained audio signal is fed to the low-pass filter comprised of the resistor R2 and the variable capacitor C1, and only a low-frequency audio component signal is extracted from an entire audio-frequency band and output through both ends (of which one is grounded) of the variable capacitor C1 to the pan circuit 6.

In the present embodiment, as in the above embodiment described above with reference to FIG. 2, the proportion of voltages divided in the variable resistor R1 and a capacity of the variable capacitor C1 (which is an element for determining the cutoff frequency of the low-pass filter) are adjusted in a correlated manner so that if the attenuation of the input audio signal by the variable resistor R1 is raised, an audio signal level of a high-audio-frequency component is attenuated.

The embodiment as illustrated in FIG. 3 is one of the simplest examples, and it is understood that an active filter circuit using an operational amplifier (OP-amp) or the like may further be provided to more accurately simulate the effects of sound absorption into air.

As in the above description, to produce a natural sense of distance in a sound as if a sound source is moving away, an amount of attenuation of an audio signal is increased in an entire audio-frequency band and an audio signal level of a high-audio-frequency component is attenuated (i.e., a cutoff frequency of the low-pass filter is lowered) at the same time. Conversely, to produce a natural sense of distance in a sound as if a sound source is approaching, an amount of attenuation of the audio signal is lowered in an entire audio-frequency band and an audio signal level of a high-audio-frequency component is raised (i.e., a cutoff frequency of the low-pass filter is raised) at the same time.

Although the preferred embodiment of the present invention has been described above, various modifications and changes may be made in the present invention without departing from the spirit and scope thereof.

According to the present invention, an adequate adjustment can be made to a sense of distance from a sound source so as to make the sound more natural. The only operation required is to manipulate an AUX (quantity of signals transmitted from the post-fader terminal) and a distance filter (i.e., to adjust two adjustment elements). To be more specific, the need for adjusting three adjustment elements, as arising in a conventional audio mixing circuit, i.e., to attenuate an audio signal level using a fader, to attenuate high-audio-frequency components of the audio signal using an equalizer, and to adjust the quantity of signals transmitted through AUX from the post-fader terminal can advantageously be obviated. Therefore, the load of an operator of the audio mixer can considerably be reduced, and the sound quality of programs produced by means of the audio mixer can be improved enormously.

What is claimed is:

1. An audio mixing circuit comprising:
   an equalizer;
   a fader operably coupled and cascaded to the equalizer;
   a distance filter operably coupled and cascaded to the fader; and
   a pan circuit operably coupled and cascaded to the distance filter,
   wherein the distance filter comprises a variable attenuator and a low-pass filter, and operates the variable attenuator and the low-pass filter, in a correlated manner such that:
   (a) a cutoff frequency of the low-pass filter is lowered as an amount of attenuation of an audio signal is increased in an entire audio-frequency band, and
   (b) the cutoff frequency of the low-pass filter is raised when the amount of attenuation of an audio signal is lowered in an entire audio-frequency band.

2. An audio mixing circuit according to claim 1, wherein the variable attenuator attenuates an input audio signal to an arbitrary level, and the low-pass filter varies a cutoff frequency, wherein one of the variable attenuator and the low-pass filter is coupled and cascaded to the other of the variable attenuator and the low-pass filter; and
   wherein an amount of attenuation of the variable attenuator and the cutoff frequency of the low-pass filter are determined so that the cutoff frequency is lower when the amount of attenuation is larger.

3. An audio mixing circuit according to claim 1, wherein the low-pass filter comprises a resistor and a variable capacitor.

* * * * *